US011488796B2

(12) United States Patent
Chua et al.

(10) Patent No.: US 11,488,796 B2
(45) Date of Patent: Nov. 1, 2022

(54) THERMAL BREAK FOR HIGH-FREQUENCY ANTENNAE

(71) Applicant: Applied Materials, Inc., Santa Clara, CA (US)

(72) Inventors: Thai Cheng Chua, Cupertino, CA (US); Hanh Nguyen, San Jose, CA (US); Philip Allan Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 34 days.

(21) Appl. No.: 16/828,602

(22) Filed: Mar. 24, 2020

(65) Prior Publication Data
US 2020/0343065 A1    Oct. 29, 2020

Related U.S. Application Data

(60) Provisional application No. 62/837,922, filed on Apr. 24, 2019.

(51) Int. Cl.
| H01H 37/76 | (2006.01) |
| H05H 1/46  | (2006.01) |
| H05K 7/20  | (2006.01) |
| H01L 35/28 | (2006.01) |

(52) U.S. Cl.
CPC ............ *H01H 37/76* (2013.01); *H01L 35/28* (2013.01); *H05H 1/46* (2013.01); *H05K 7/20409* (2013.01); *H05H 2242/20* (2021.05)

(58) Field of Classification Search
None
See application file for complete search history.

(56) References Cited

U.S. PATENT DOCUMENTS

| 4,555,588 A   | 11/1985 | DuPont |                |
|---------------|---------|--------|----------------|
| 5,877,471 A * | 3/1999  | Huhn   | H05H 1/30      |
|               |         |        | 219/121.48     |
| 6,105,518 A * | 8/2000  | Robson | H01J 37/32522  |
|               |         |        | 134/1.1        |

(Continued)

FOREIGN PATENT DOCUMENTS

| JP | 2011-171252    | 9/2011  |
| TW | 201344780 A    | 11/2013 |

(Continued)

OTHER PUBLICATIONS

International Search Report and Written Opinion for PCT/US2020/026223 dated Jul. 23, 2020, 10 pgs.

(Continued)

*Primary Examiner* — Srinivas Sathiraju
(74) *Attorney, Agent, or Firm* — Schwabe, Williamson & Wyatt, P.C.

(57) ABSTRACT

Embodiments disclosed herein include a high-frequency emission module. In an embodiment, the high-frequency emission module comprises a solid state high-frequency power source, an applicator for propagating high-frequency electromagnetic radiation from the power source, and a thermal break coupled between the power source and the applicator. In an embodiment, the thermal break comprises a substrate, a trace on the substrate, and a ground plane.

9 Claims, 11 Drawing Sheets

(56) References Cited

U.S. PATENT DOCUMENTS

| | | | | |
|---|---|---|---|---|
| 6,385,972 | B1* | 5/2002 | Fellows | F02G 1/0435 60/517 |
| 6,514,376 | B1* | 2/2003 | Collins | H01J 37/32165 118/724 |
| 6,660,177 | B2* | 12/2003 | Carr | H01J 37/32376 257/E21.243 |
| 6,759,808 | B2* | 7/2004 | Grotjohn | H05H 1/46 315/111.21 |
| 6,800,559 | B2* | 10/2004 | Bar-Gadda | H01L 21/31138 257/E21.252 |
| 7,309,842 | B1* | 12/2007 | Doughty | G01J 3/443 219/121.36 |
| 7,889,503 | B2* | 2/2011 | Nagareda | H01L 23/467 174/16.3 |
| 8,614,898 | B2* | 12/2013 | Hiramatsu | H05K 1/0293 428/209 |
| 8,822,876 | B2* | 9/2014 | Tavassoli | H05H 1/46 118/724 |
| 9,248,509 | B2* | 2/2016 | Tavassoli | H01L 21/67069 |
| 9,293,680 | B2* | 3/2016 | Poliquin | F01N 5/025 |
| 9,330,889 | B2* | 5/2016 | Denning | H01J 37/32247 |
| 9,693,488 | B2* | 6/2017 | Singh | H05K 3/0061 |
| 9,860,987 | B2* | 1/2018 | Singh | H01L 23/473 |
| 10,090,134 | B2* | 10/2018 | Godyak | H01J 37/32183 |
| 10,504,699 | B2* | 12/2019 | Kraus | H01J 37/32201 |
| 10,720,311 | B2* | 7/2020 | Kraus | H01Q 21/0025 |
| 10,943,768 | B2* | 3/2021 | Nguyen | H01J 37/3244 |
| 11,114,282 | B2* | 9/2021 | Kraus | H01Q 21/0025 |
| 2004/0218362 | A1* | 11/2004 | Amaro | H05K 7/20409 361/679.54 |
| 2008/0055861 | A1* | 3/2008 | Nagareda | H05K 9/0022 257/E23.099 |
| 2009/0042376 | A1* | 2/2009 | Ma | B23K 26/0876 257/E21.473 |
| 2009/0159214 | A1* | 6/2009 | Kasai | H01J 37/32256 422/186.04 |
| 2010/0074807 | A1* | 3/2010 | Bulkin | H01J 37/32678 422/186.03 |
| 2010/0213851 | A1* | 8/2010 | Chang Diaz | H05H 1/54 315/111.41 |
| 2011/0045205 | A1* | 2/2011 | Rostaing | H05H 1/46 118/723 AN |
| 2012/0018410 | A1* | 1/2012 | Zakrzewski | H05H 1/46 219/121.48 |
| 2012/0091104 | A1* | 4/2012 | Tavassoli | H01L 21/6833 279/128 |
| 2013/0133338 | A1* | 5/2013 | Ludwig | H01L 23/38 136/200 |
| 2013/0146115 | A1* | 6/2013 | Ludwig | H01L 23/38 136/200 |
| 2013/0186447 | A1* | 7/2013 | Ludwig | H01L 35/28 136/203 |
| 2013/0186448 | A1* | 7/2013 | Ranalli | F01N 3/36 60/272 |
| 2013/0255739 | A1* | 10/2013 | Kossakovski | F28D 15/0266 136/201 |
| 2013/0278140 | A1* | 10/2013 | Mudunuri | H01J 65/042 315/111.21 |
| 2014/0138361 | A1* | 5/2014 | Zakrzewski | H05H 1/46 315/111.21 |
| 2014/0375203 | A1* | 12/2014 | Goscha | H01J 61/28 445/26 |
| 2015/0144265 | A1* | 5/2015 | Fujino | H05H 1/46 118/723 MW |
| 2015/0200075 | A1* | 7/2015 | Godyak | H01J 37/32183 315/111.51 |
| 2015/0371828 | A1* | 12/2015 | Stowell | C23C 16/4405 118/723 AN |
| 2016/0242313 | A1* | 8/2016 | Singh | H01L 23/473 |
| 2018/0053634 | A1* | 2/2018 | Kraus | H01J 37/32211 |
| 2018/0144907 | A1* | 5/2018 | Franklin | H01J 37/32981 |
| 2018/0226225 | A1* | 8/2018 | Koh | H01L 21/6833 |
| 2018/0294143 | A1* | 10/2018 | Chua | H01J 37/3299 |
| 2018/0323043 | A1* | 11/2018 | Kraus | C23C 14/357 |
| 2019/0326096 | A1* | 10/2019 | Kraus | H01Q 21/0025 |
| 2020/0022246 | A1* | 1/2020 | Chen | H01J 37/32467 |
| 2020/0066490 | A1* | 2/2020 | Kraus | H01J 37/32229 |
| 2020/0176241 | A1* | 6/2020 | Vats | H01L 21/02329 |
| 2020/0303167 | A1* | 9/2020 | Kraus | H01J 37/32201 |
| 2020/0343065 | A1* | 10/2020 | Chua | H05H 1/463 |
| 2020/0402769 | A1* | 12/2020 | Chua | H01J 37/32266 |
| 2021/0100076 | A1* | 4/2021 | Carducci | H05B 6/686 |
| 2021/0391149 | A1* | 12/2021 | Kraus | H01J 37/32467 |

FOREIGN PATENT DOCUMENTS

| | | | |
|---|---|---|---|
| TW | 201828404 A | 8/2018 | |
| WO | WO-2020219249 A1 * | 10/2020 | H01H 37/76 |

OTHER PUBLICATIONS

International Preliminary Report on Patentability for PCT/US2020/026223 dated Nov. 4, 2021, 7 pgs.

Official Letter from Taiwan Patent Application No. 109113265 dated Aug. 8, 2022, 11 pgs.

* cited by examiner

THERMAL BREAK FOR HIGH-FREQUENCY ANTENNAE

CROSS-REFERENCE TO RELATED APPLICATIONS

This application claims the benefit of U.S. Provisional Application No. 62/837,922, filed on Apr. 24, 2019, the entire contents of which are hereby incorporated by reference herein.

BACKGROUND

1) Field

Embodiments relate to the field of semiconductor manufacturing and, in particular, to thermal solutions for high-frequency plasma sources.

2) Description of Related Art

The electrical components of a high-frequency plasma system are susceptible to heat. For example, the high-frequency plasma source and cables (e.g., coaxial cables or the like) may be damaged or degraded by the heat generated by the system. Particularly, heat generated by the plasma or heat from a heated chamber may be transferred from the antenna back towards the electrical components that drive the plasma. In some instances the heat generated by the system is sufficient to melt connections between the source of high-frequency power and the antenna.

SUMMARY

Embodiments disclosed herein include a high-frequency emission module. In an embodiment, the high-frequency emission module comprises a solid state high-frequency power source, an applicator for propagating high-frequency electromagnetic radiation from the power source, and a thermal break coupled between the power source and the applicator. In an embodiment, the thermal break comprises a substrate, a trace on the substrate, and a ground plane.

Embodiments may also include a processing tool. In an embodiment, the processing tool comprises a processing chamber, and a modular high-frequency emission source. In an embodiment, the modular high-frequency emission source comprises a plurality of high-frequency emission modules. In an embodiment, each high frequency emission module comprises an oscillator module, an amplification module coupled to the oscillator module, a thermal break coupled to the amplification module, and an applicator. In an embodiment, the applicator is coupled to the amplification module by the thermal break, and the applicator is positioned opposing a chuck in the processing chamber on which one or more substrates are processed.

Embodiments may also include a thermal break for a high-frequency plasma source. In an embodiment, the thermal break comprises a substrate having a first surface and a second surface opposite the first surface, where the substrate comprises one or more dielectric layers. In an embodiment, the thermal break further comprises a connector coupled to the substrate, where the connector is configured to receive a coaxial cable, and a conductive trace interfacing with the connector, and where the conductive trace extends from the connector towards an edge of the substrate opposite from the connector. In an embodiment, the thermal break further comprises a ground plane embedded in the substrate, where the ground plane is not electrically coupled to the conductive trace, and a thermal solution thermally coupled to the substrate.

DETAILED DESCRIPTION

Systems and methods described herein include thermal solutions for high-frequency plasma sources. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, plasma processing tools that utilize high-frequency plasma sources are susceptible to degradation or damage resulting from heat transfer from the plasma and/or the chamber to the power source and the cabling between the power source and the antenna. In some instances, it has even been observed that the thermal load causes the cabling to melt. Accordingly, embodiments disclosed herein include a thermal break that thermally isolates the cabling and the solid state electronics of the power source from the thermal load supplied by a plasma and/or the chamber.

In some embodiments, the thermal break is located between the applicator (e.g., an antenna) and solid state electronics of the processing tool. For example, the solid state electronics may be electrically coupled to the thermal break by a coaxial cable, and the thermal break may be directly coupled to the antenna. In addition to providing thermal isolation between components of the processing tool, the thermal break also provides an electrical coupling from the coaxial cable to the antenna. In some embodiments, the thermal break may also function as an impedance matching element in order to allow for efficient transfer of power to the plasma. Accordingly, the impedance matching and the thermal regulation may be implemented in a single component (i.e., the thermal break). This reduces the complexity and provides for a compact construction.

Figure 1:
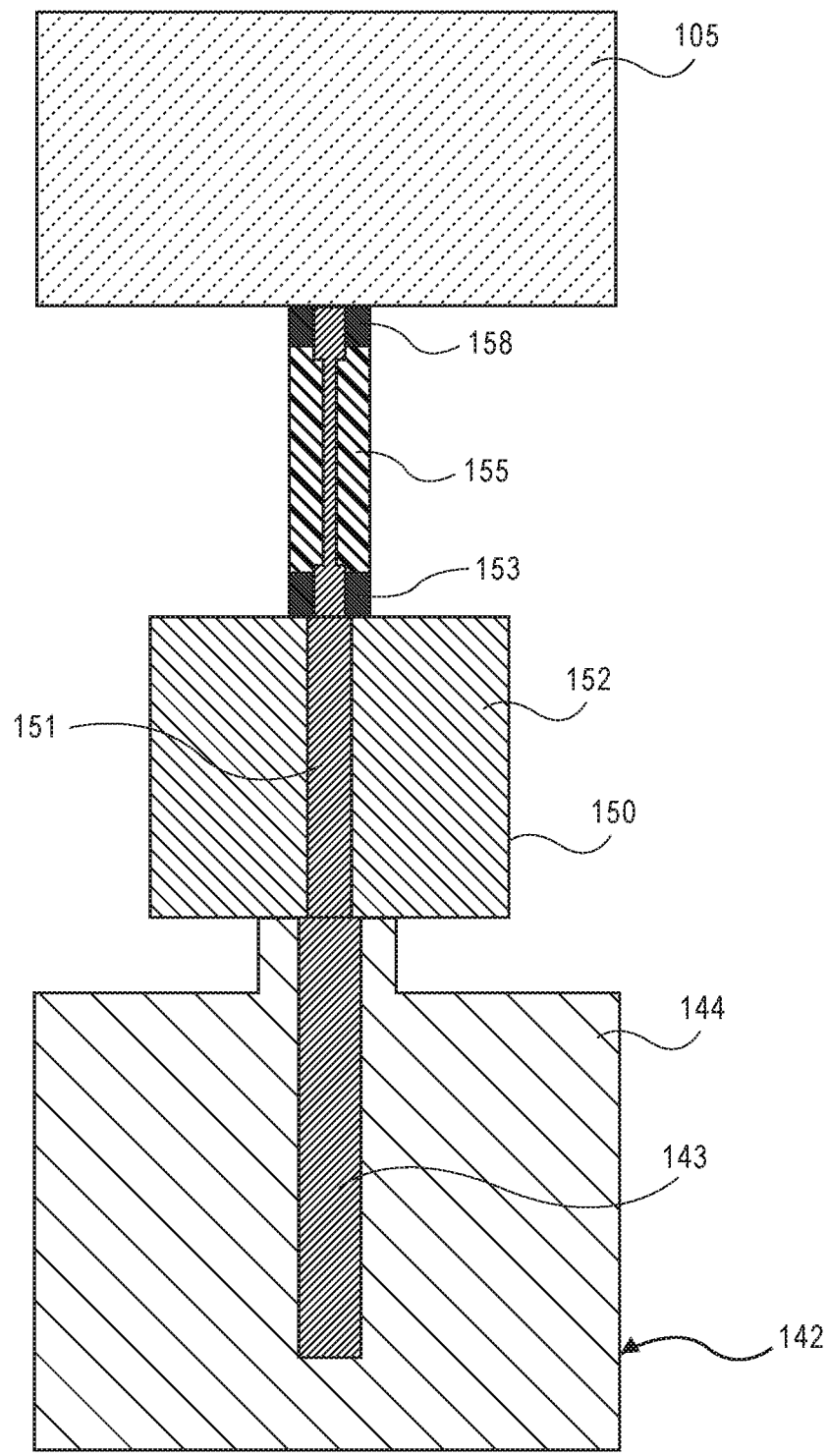
FIG. 1 is a cross-sectional illustration of a high-frequency emission module with a thermal break between the power source and the applicator, in accordance with an embodiment.

Referring now to FIG. 1, a cross-sectional illustration of a high-frequency emission module 103 is shown, in accordance with an embodiment. In an embodiment, the high-frequency emission module 103 may comprise a solid state power source 105, a thermal break 150, and an applicator 142.

The solid state power source 105 may comprise a plurality of sub-components, such as an oscillator, amplifiers, and other circuitry blocks. A more detailed description of the solid state power source 105 is provided below with respect to FIG. 5. In an embodiment, the power source 105 provides high-frequency electromagnetic radiation to the applicator 142. As used herein, "high-frequency" electromagnetic radiation include radio frequency radiation, very-high-frequency radiation, ultra-high-frequency radiation, and microwave radiation. "High-frequency" may refer to frequencies between 0.1 MHz and 300 GHz.

In an embodiment, the applicator 142 may comprise a dielectric body 144 with a cavity into which an antenna 143 is disposed. For example, the antenna 143 may comprise a conductive line (e.g., a monopole) that extends into the dielectric body 144. In some embodiments, the antenna 143 is in direct contact with the dielectric body 144. In other embodiments, the cavity is larger than the antenna 143, and the antenna 143 is spaced away from surfaces of the dielectric body 144.

In an embodiment, the applicator 142 may be electrically coupled to the thermal break 150. The thermal break 150 may comprise a substrate 152 and a conductive trace 151. In an embodiment, the substrate 152 may be a printed circuit board (PCB) or the like. That is, the substrate 152 may comprise one or more dielectric layers. In the illustrated embodiment, the trace 151 is shown as being above the substrate 152. In a particular embodiment, the conductive trace 151 may be a microstrip. However, it is to be appreciated that the trace 151 may be embedded within the substrate 152 in some embodiments. In a particular embodiment, the conductive trace 151 may be a stripline. That is, a ground plane (not shown in FIG. 1) may be above the conductive trace 151, below the conductive trace 151, or above and below the conductive trace. In some embodiments, the ground plane is embedded in the substrate 152. In other embodiments, the ground plane may be below or above the substrate 152. In yet another embodiment, the substrate 152 may comprise two distinct substrates (i.e., a first substrate and a second substrate) that are bonded together. In such embodiments, the conductive trace 151 may be between the first substrate and the second substrate.

In an embodiment, the thermal break 150 may also comprise a thermal solution. The thermal solution may provide thermal regulation to the high-frequency emission module 103. Since the thermal break 150 is located between the applicator 142 and the solid state power source 105, thermal energy (e.g., from the plasma or a heated chamber) is dissipated prior to reaching the solid state power source 105.

Furthermore, cabling and connectors (e.g., a coaxial cable 155 and connectors 153) between the thermal break 150 and the solid state power source 105 is protected from thermal energy dissipated by the system. In an embodiment, the coaxial cable 155 may be electrically coupled between the solid state power source 105 and the thermal break 150 with connectors 153, as is known in the art. For example, a connector 153 may electrically couple the coaxial cable 155 to the conductive trace 151.

Figure 2A:
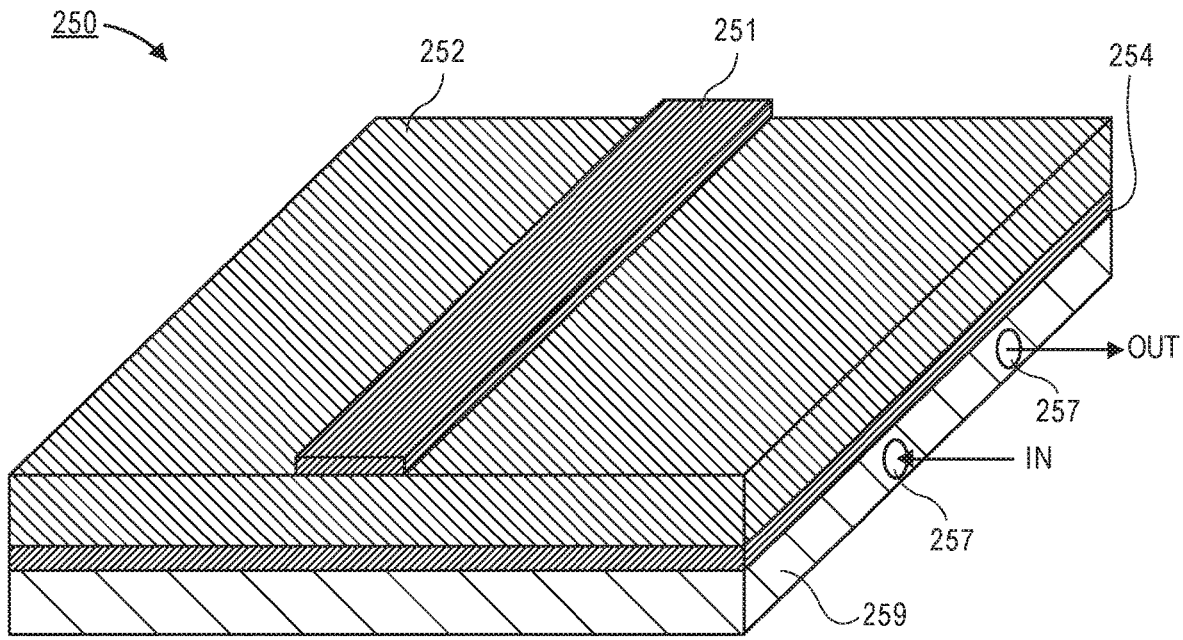
FIG. 2A is a perspective view illustration of a thermal break with fluidic channels through a thermal block to provide heat dissipation, in accordance with an embodiment.
Figure 2B:
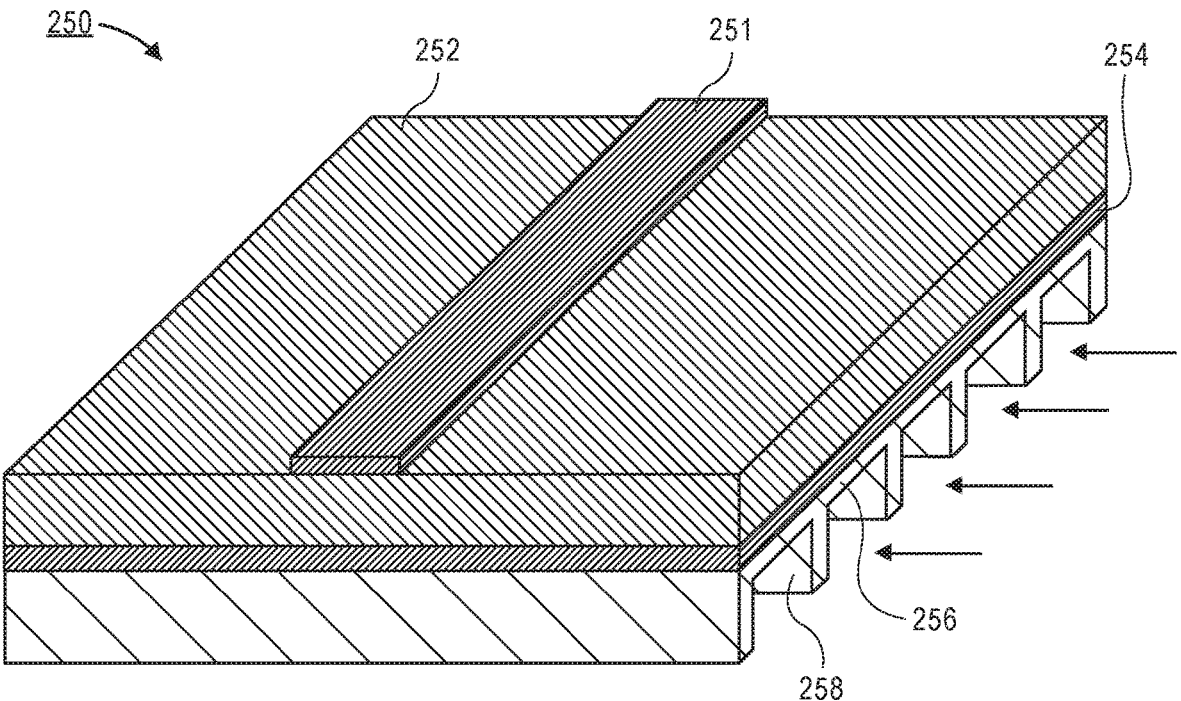
FIG. 2B is a perspective view illustration of a thermal break with a plurality of fins for heat dissipation, in accordance with an embodiment.
Figure 2C:
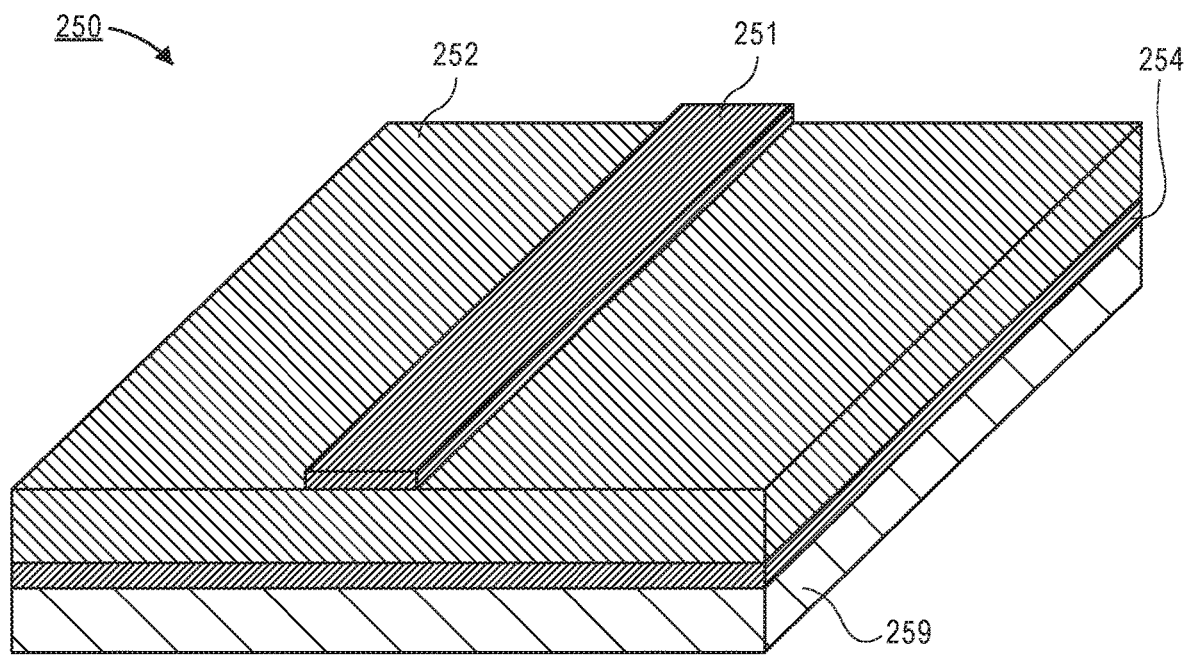
FIG. 2C is a perspective view illustration of a thermal break with a thermoelectric cooling block to provide heat dissipation, in accordance with an embodiment.

Referring now to FIGS. 2A-2C, a series of perspective view illustrations of a thermal break 250 with various thermal solutions is shown, in accordance with different embodiments. It is to be appreciated that the thermal solutions shown in FIGS. 2A-2C are exemplary in nature, and that any suitable thermal solution may be used in conjunction with the thermal break, in accordance with an embodiment. Furthermore, while various thermal solutions are shown in isolation, it is to be appreciated that the thermal solutions may be combined in order to provide even more efficient dissipation of thermal energy.

Referring now to FIG. 2A, a perspective view illustration of a thermal break 250 with a fluidic cooling thermal solution is shown, in accordance with an embodiment. In an embodiment, the trace 251 is shown over a top surface of the substrate 252, and a ground plane 254 is below the substrate 252. In an embodiment, a thermal block 256 may be attached to the ground plane 254. The thermal block 256 may comprise a material with a high thermal conductivity. For example, the thermal block 256 may comprise a metallic material.

In an embodiment, one or more channels 257 may be embedded in the thermal block 256. The channels 256 may be suitable for flowing a coolant through the thermal block 256 in order to remove heat from the system. As shown, a single inlet (IN) and a single outlet (OUT) are shown. However, it is to be appreciated that the thermal block 256 may comprise any number of inlets and outlets.

In an embodiment, the coolant may comprise any suitable coolant fluid. For example, the coolant fluid may comprise a liquid (e.g., a water-glycol mixture) or a gas (e.g., air, helium, etc.). The coolant fluid may be stored in a reservoir. The reservoir may be actively cooled in order to improve the heat extraction from the thermal break 250.

Referring now to FIG. 2B, a perspective view illustration of a thermal break 250 with an air cooling thermal solution is shown, in accordance with an embodiment. As shown, the thermal block 256 may also comprise a plurality of fins 258 that extend away from the thermal break 250. In an embodiment, the fins 258 increase the surface area of the thermal block 256 in order to aid in removal of heat by convection. For example, air (as indicated by the arrows) may be flown past the fins 258 to increase thermal dissipation of the thermal break 250. In an embodiment, the airflow may be generated by a fan or the like. In other embodiments, there may be no active cooling and the fins 258 may dissipate thermal energy to ambient air.

Referring now to FIG. 2C, a perspective view illustration of a thermal break 250 with a thermoelectric cooling thermal solution is shown, in accordance with an embodiment. In such an embodiment, the thermal block may be replaced with an active cooling device, such as a thermoelectric cooler (TEC) 259. In such an embodiment, voltage applied to the TEC 259 may drive the removal of heat from the thermal break 250.

In addition to providing thermal dissipation from the system, embodiments may also include a thermal break that has a dual functionality. Particularly, the thermal break may also provide impedance matching to the system. By controlling the shape of the conductive trace, the impedance matching of the system may be modulated. Examples of various shaped traces 351 that may be used to providing impedance matching are shown in FIGS. 3A-3C.

Figure 3A:
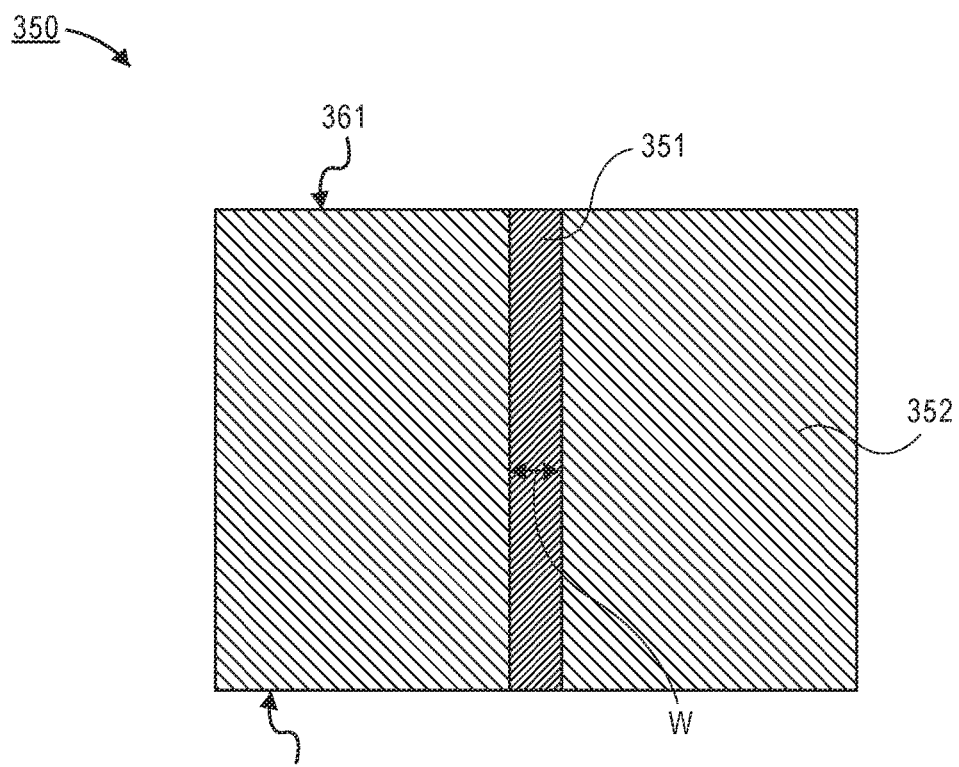
FIG. 3A is a plan view illustration of a conductive trace with a uniform width that extends across the thermal break, in accordance with an embodiment.

Referring now to FIG. 3A, a plan view illustration of a thermal break 350 is shown, in accordance with an embodiment. In an embodiment, the thermal break 350 may comprise a substrate 352 and a trace 351 over the substrate 352. The trace 351 may extend from a first edge 361 of the substrate 352 to a second edge 362 of the substrate 352. While shown as extending all the way to the edges 361/362 of the substrate 352, it is to be appreciated that the inclusion of connectors (not shown in FIG. 3A) may result in the trace 351 not extending all the way to the edge of the substrate 352.

In an embodiment, the trace 351 may have a substantially uniform width W and extend linearly across the substrate 352. That is, the trace 351 may have a substantially rectangular shape. In other embodiments, the trace 351 may have a non-linear path across the substrate 352. For example, the trace 351 may include a serpentine pattern in order to increase the length of the trace 351. In other embodiments, the trace 351 may have a first width at the first edge 361 and a second width at the second edge 362. In an embodiment, a width W of the trace 351 may be substantially uniform (e.g., the first width and the second width are substantially the same), or the width of the trace 351 may be a substantially non-uniform width W across a length of the trace (e.g., a width of the trace 351 proximate to the first edge 361 may be different than a width of the trace 351 proximate to the second edge 362). In an embodiment, the trace 351 may have a rectangular cross-section (i.e., the cross-section in the X-Z plane may be rectangular). In other embodiments, the trace 351 may have a non-rectangular cross-section in the X-Z plane. For example, the cross-section of the trace 351 in the X-Z plane may be trapezoidal. In other embodiments, the trace 351 may comprise a first trace and a second trace directly over the first trace. The first trace and the second trace may have different widths. For example, the first trace may have a width that is greater than a width of the second trace, or the first trace may have a width that is less than a width of the second trace.

Figure 3B:
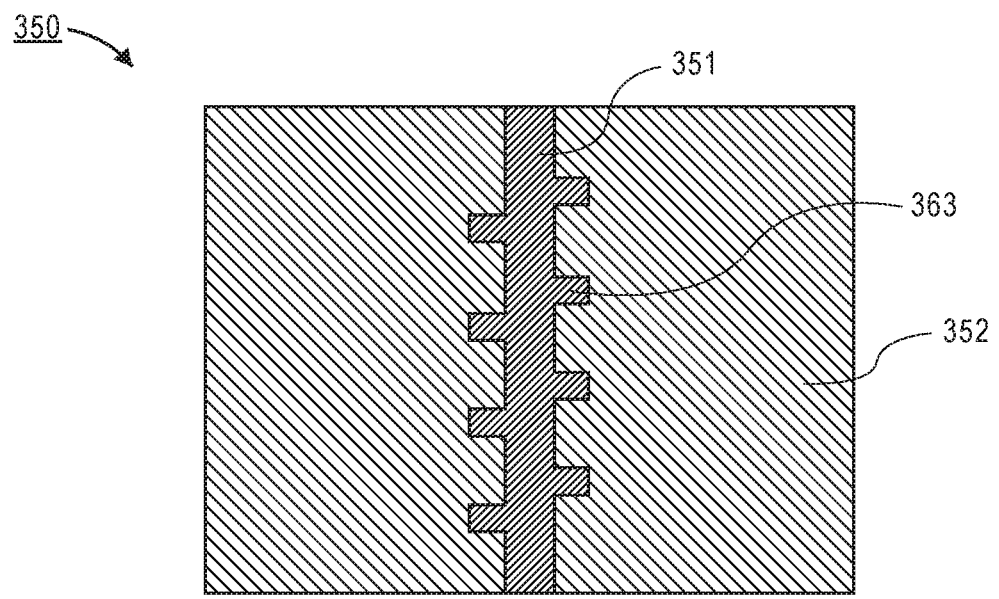
FIG. 3B is a plan view illustration of a thermal break with a conductive trace that comprises a plurality of stubs extending away from the main length of the trace, in accordance with an embodiment.
Figure 3C:
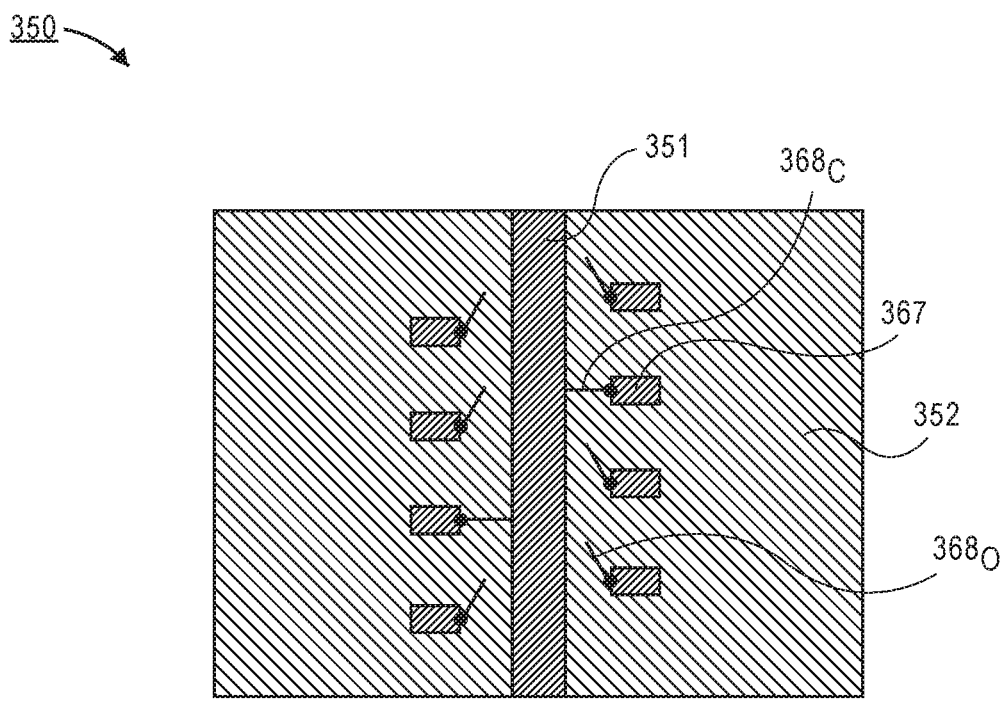
FIG. 3C is a plan view illustration of a thermal break that comprises a trace and a plurality of stubs that are selectively attached to the trace by one or more mechanical switches, in accordance with an embodiment.

Referring now to FIG. 3B, a plan view illustration of a thermal break 350 with a trace 351 that comprises one or more stubs 363 is shown, in accordance with an embodiment. In an embodiment, the stubs 363 may be conductive extensions that extend out from the main body of the trace 351. In some embodiments, the stubs 363 may be monolithic with the trace 351. That is, the trace 351 and the stubs 363 may be fabricated at the same time. In such embodiments, the stubs 363 may comprise substantially the same material as the trace 351 and have a thickness (in the Z-direction out of the plane of FIG. 3B) that is substantially equal to a thickness of the trace 351. In other embodiments, the stubs 363 may be attached to the trace 351 after the trace is formed. For example, solder may be applied to the edge of the trace 351 in order to modify the impedance of the thermal break 350. In such embodiments, the stubs 363 may comprise different materials than the trace 351 and may comprise a different thickness (in the Z-direction) than the trace 351. In an embodiment, one or more of the stubs 363 may be open stubs (i.e., not coupled to the ground plane). In an additional embodiment, one or more of the stubs 363 may be short stubs (i.e., the stubs 363 may be shorted to the ground plane).

Referring now to FIG. 3C, a plan view illustration of a thermal break 350 is shown, in accordance with an additional embodiment. In an embodiment, the thermal break 350 may comprise a plurality of stubs 367 that are selectively attachable to the trace 351 by switches 368. In an embodiment, when the switch is closed (e.g., switch $368_C$), the stub 367 is electrically coupled to the trace 351, and when the switch is opened (e.g., switch $368_O$), the stub 367 is not electrically coupled to the trace 351. In an embodiment, the switches 368 may be manually operated. In other embodiments, the switches 368 may be controlled by a computer system and used to dynamically change the impedance as processing conditions change. In an embodiment, the switches 368 may be mechanical switches. In other embodiments, the switches 368 may be solid state switches.

Figure 4:
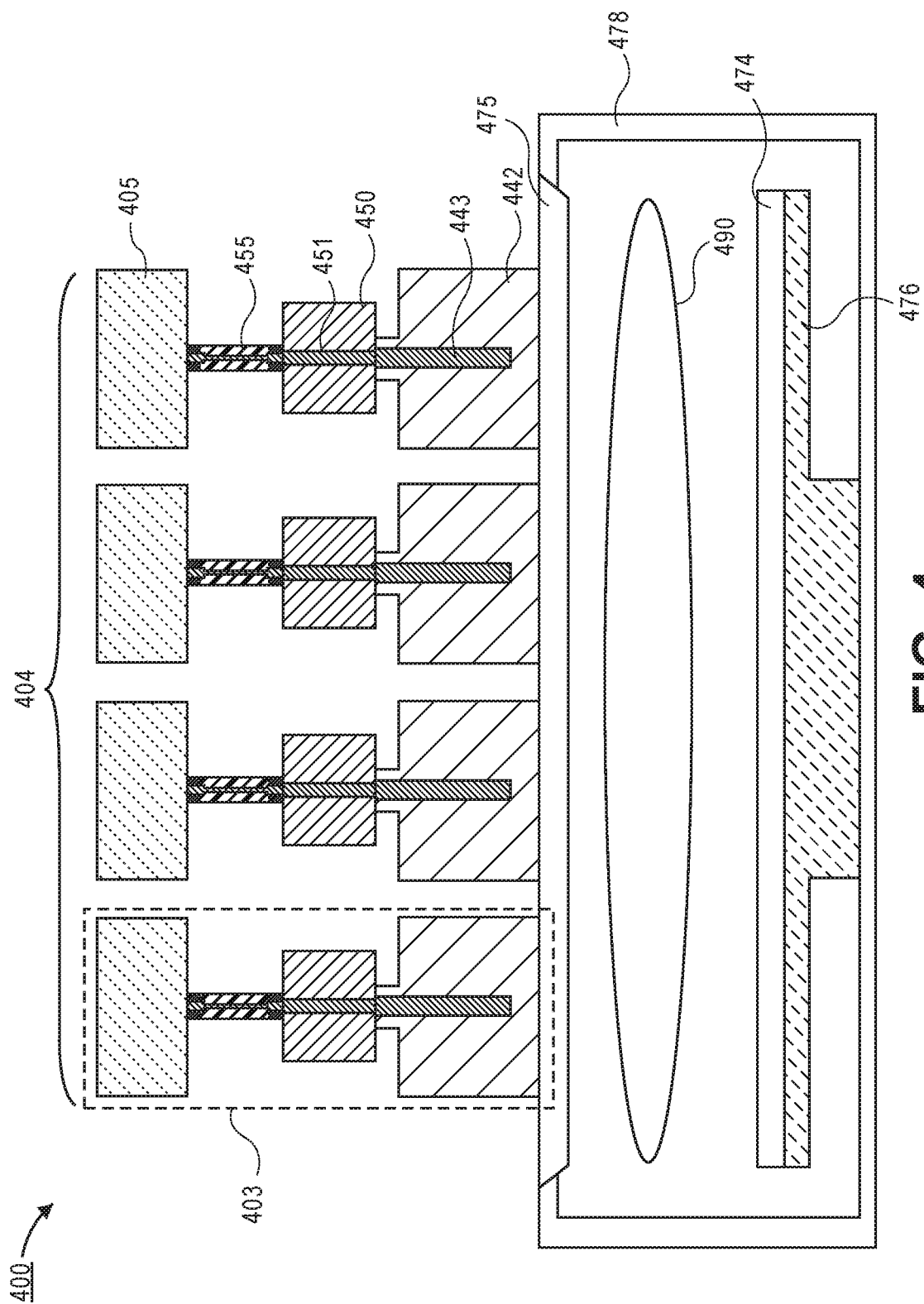
FIG. 4 is a cross-sectional illustration of a processing tool that comprises a modular high-frequency emission source with a plurality of high frequency emission modules that each include a thermal break, in accordance with an embodiment.

Referring now to FIG. 4, a cross-sectional schematic illustration of a processing system 400 with a modular high-frequency emission source 404 is shown, in accordance with an embodiment. In an embodiment, the modular high-frequency emission source 404 may comprise a plurality of high-frequency emission modules 403. The high-frequency emission modules 403 may be substantially similar to the high-frequency emission modules 103 described above. For example, the high-frequency emission modules 403 may each comprise a solid state power source 405, a thermal break 450, and an applicator 442. In an embodiment, high-frequency electromagnetic radiation may be generated by the solid state power source 405 and transmitted to the antenna 443 of the applicator along a cable 445 and a trace 451 on the thermal break 450. In an embodiment, the thermal break 450 may comprise one or more cooling solutions, such as those described above.

In an embodiment, the modular high-frequency emission source 404 may inject high-frequency electromagnetic radiation into a chamber 478 through a dielectric window 475. The high-frequency electromagnetic radiation may induce a plasma 490 in the chamber 478. The plasma 490 may be used to process a substrate 474 that is positioned on a support 476 (e.g., an electrostatic chuck (ESC) or the like).

Figure 5:
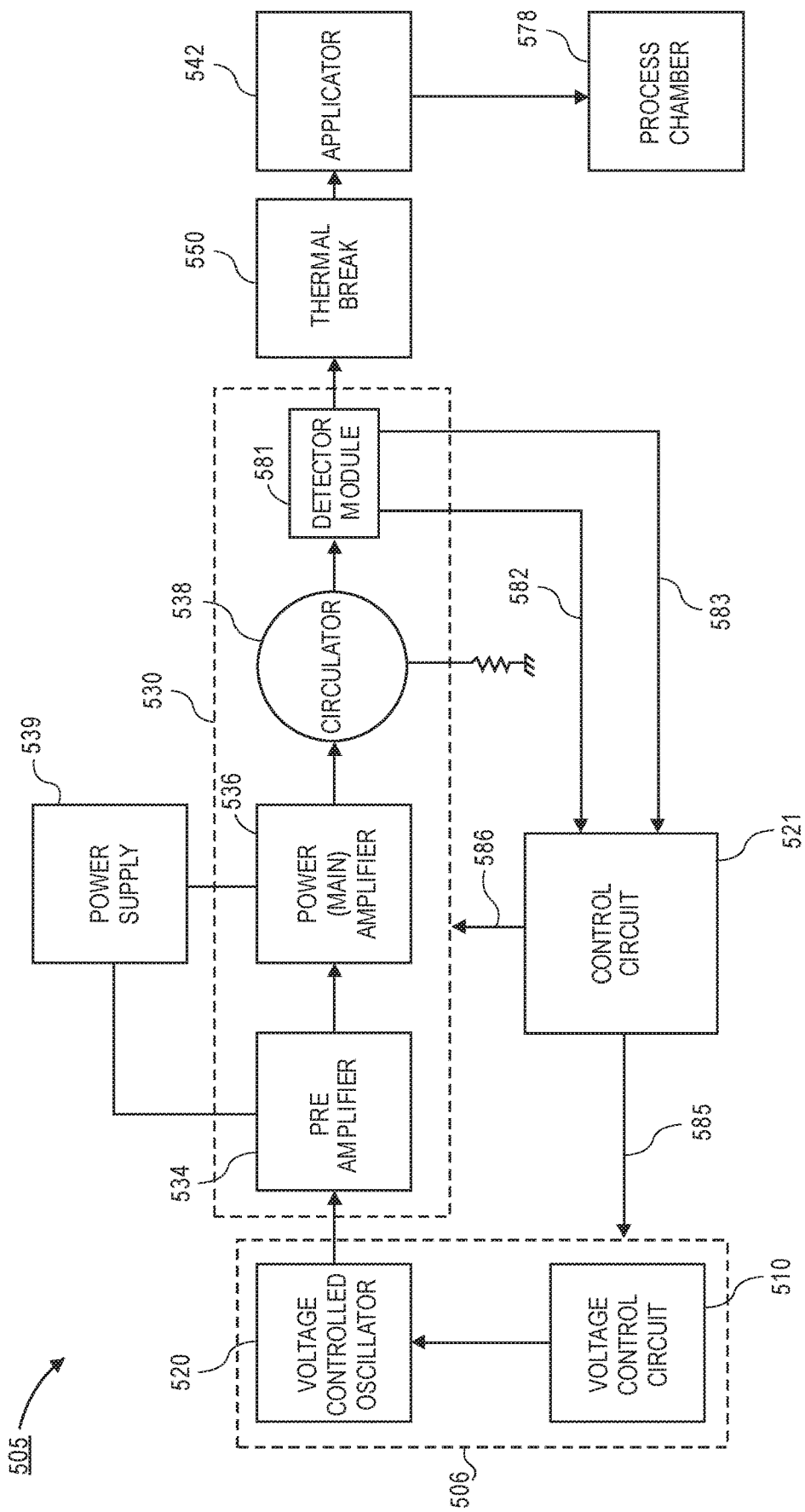
FIG. 5 is a block diagram of a modular high-frequency emission module, in accordance with an embodiment.

Referring now to FIG. 5, a schematic of a solid state power source 505 is shown, in accordance with an embodiment. In an embodiment, the solid state power source 505 comprises an oscillator module 506. The oscillator module 506 may include a voltage control circuit 510 for providing an input voltage to a voltage controlled oscillator 520 in order to produce high-frequency electromagnetic radiation at a desired frequency. Embodiments may include an input voltage between approximately 1V and 10V DC. The voltage controlled oscillator 520 is an electronic oscillator whose oscillation frequency is controlled by the input voltage. According to an embodiment, the input voltage from the voltage control circuit 510 results in the voltage controlled oscillator 520 oscillating at a desired frequency. In an embodiment, the high-frequency electromagnetic radiation may have a frequency between approximately 0.1 MHz and 30 MHz. In an embodiment, the high-frequency electromagnetic radiation may have a frequency between approximately 30 MHz and 300 MHz. In an embodiment, the high-frequency electromagnetic radiation may have a frequency between approximately 300 MHz and 1 GHz. In an embodiment, the high-frequency electromagnetic radiation may have a frequency between approximately 1 GHz and 300 GHz.

According to an embodiment, the electromagnetic radiation is transmitted from the voltage controlled oscillator 520 to an amplification module 530. The amplification module 530 may include a driver/pre-amplifier 534, and a main power amplifier 536 that are each coupled to a power supply 539. According to an embodiment, the amplification module 530 may operate in a pulse mode. For example, the amplification module 530 may have a duty cycle between 1% and 99%. In a more particular embodiment, the amplification module 530 may have a duty cycle between approximately 15% and 50%.

In an embodiment, the electromagnetic radiation may be transmitted to the thermal break 550 and the applicator 542 after being processed by the amplification module 530. However, part of the power transmitted to the thermal break 550 may be reflected back due to the mismatch in the output impedance. Accordingly, some embodiments include a detector module 581 that allows for the level of forward power 583 and reflected power 582 to be sensed and fed back to the control circuit module 521. It is to be appreciated that the detector module 581 may be located at one or more different locations in the system. In an embodiment, the control circuit module 521 interprets the forward power 583 and the reflected power 582, and determines the level for the control signal 585 that is communicatively coupled to the oscillator module 506 and the level for the control signal 586 that is communicatively coupled to the amplifier module 530. In an embodiment, control signal 585 adjusts the oscillator module 506 to optimize the high-frequency radiation coupled to the amplification module 530. In an embodiment, control signal 586 adjusts the amplifier module 530 to optimize the output power coupled to the applicator 542 through the thermal break 550. In an embodiment, the feedback control of the oscillator module 506 and the amplification module 530, in addition to the tailoring of the impedance matching in the thermal break 550 may allow for the level of the reflected power to be less than approximately 5% of the forward power. In some embodiments, the feedback control of the oscillator module 506 and the amplification module 530 may allow for the level of the reflected power to be less than approximately 2% of the forward power.

Accordingly, embodiments allow for an increased percentage of the forward power to be coupled into the processing chamber 578, and increases the available power coupled to the plasma. Furthermore, impedance tuning using a feedback control is superior to impedance tuning in typical slot-plate antennas. In slot-plate antennas, the impedance tuning involves moving two dielectric slugs formed in the applicator. This involves mechanical motion of two separate components in the applicator, which increases the complexity of the applicator. Furthermore, the mechanical motion may not be as precise as the change in frequency that may be provided by a voltage controlled oscillator 520.

Figure 6A:
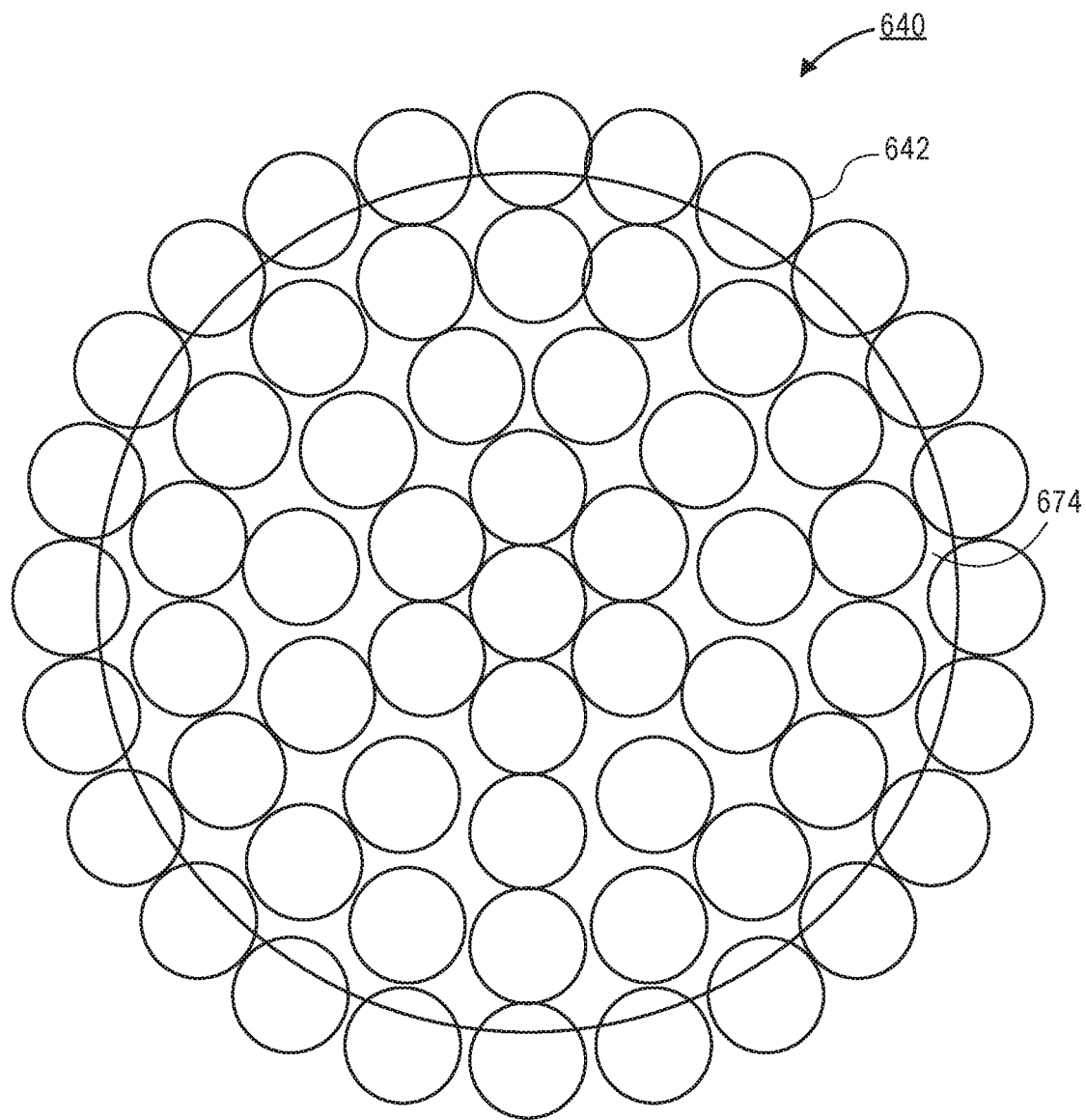
FIG. 6A is a plan view of an array of applicators that may be used to couple high-frequency radiation to a processing chamber, in accordance with an embodiment.

Referring now to FIG. 6A a plan view illustration of an array 640 of applicators 642 that are arranged in a pattern that matches a circular substrate 674 is shown, in accordance with an embodiment. By forming a plurality of applicators 642 in a pattern that roughly matches the shape of the substrate 674, the radiation field and/or plasma becomes tunable over the entire surface of the substrate 674. For example, each of the applicators 642 may be controlled so that a plasma with a uniform plasma density across the entire surface of the substrate 674 is formed and/or a uniform radiation field across the entire surface of the substrate 674 is formed. Alternatively, one or more of the applicators 642 may be independently controlled to provide plasma densities that are variable across the surface of the substrate 674. As such, incoming nonuniformity present on the substrate may be corrected. For example, the applicators 642 proximate to an outer perimeter of the substrate 674 may be controlled to have a different power density than applicators proximate to the center of the substrate 674. Furthermore, it is to be appreciated that the use of high-frequency emission modules 505 that allows for the emission of electromagnetic radiation that is at different frequencies and does not have a controlled phase relationship in order eliminate the existence of standing waves and/or unwanted interference patterns.

In FIG. 6A, the applicators 642 in the array 640 are packed together in a series of concentric rings that extend out from the center of the substrate 674. However, embodiments are not limited to such configurations, and any suitable spacing and/or pattern may be used depending on the needs of the processing tool. Furthermore, embodiments allow for applicators 642 with any symmetrical cross-section. Accordingly, the cross-sectional shape chosen for the applicator may be chosen to provide enhanced packing efficiency.

Figure 6B:
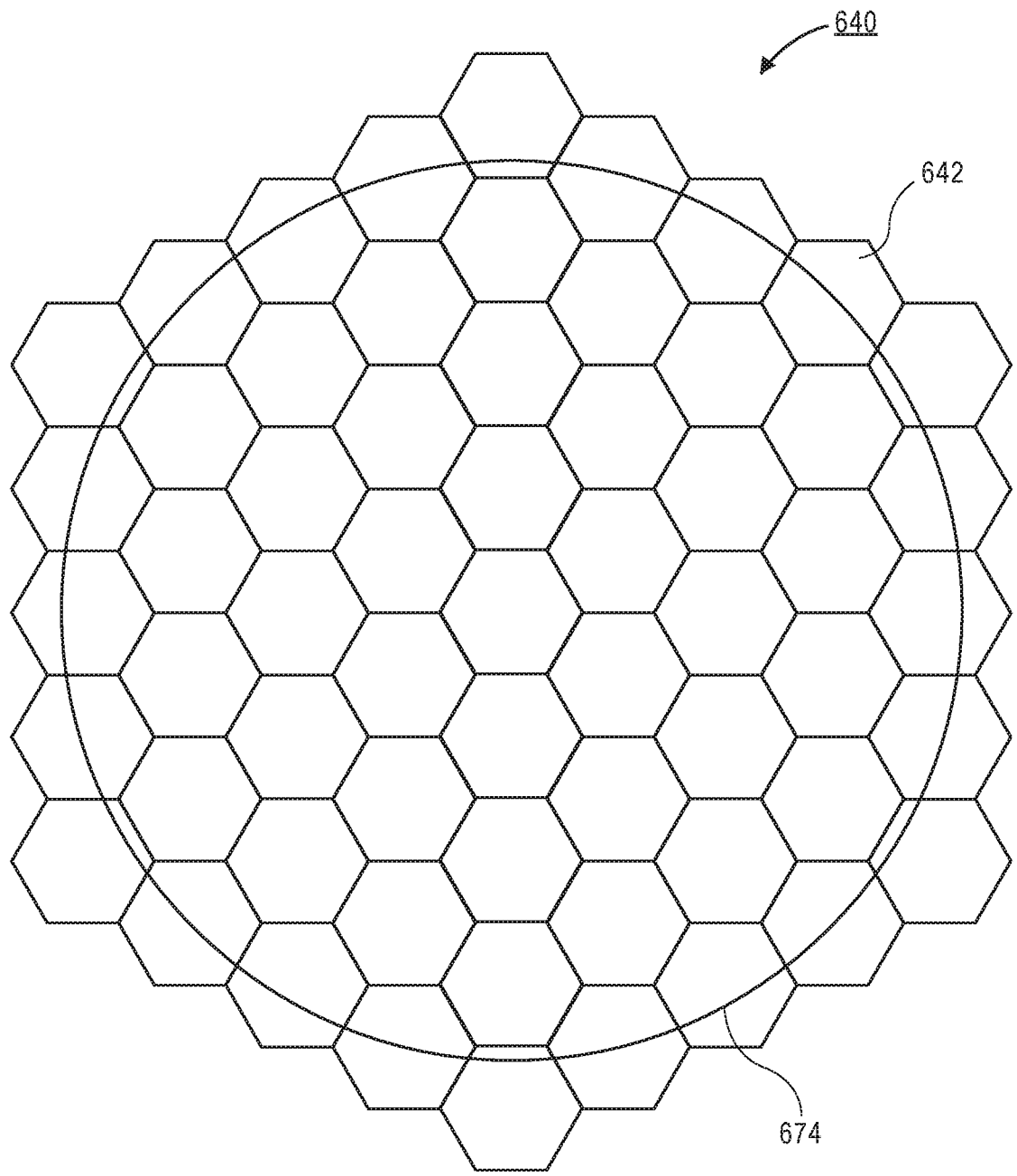
FIG. 6B is a plan view of an array of applicators that may be used to couple high-frequency radiation to a processing chamber, in accordance with an additional embodiment.

Referring now to FIG. 6B, a plan view of an array 640 of applicators 642 with a non-circular cross-section is shown, according to an embodiment. The illustrated embodiment includes applicators 642 that have hexagonal cross-sections. The use of such an applicator may allow for improved packing efficiency because the perimeter of each applicator 642 may mate nearly perfectly with neighboring applicators 642. Accordingly, the uniformity of the plasma may be enhanced even further since the spacing between each of the applicators 642 may be minimized. While FIG. 6B illustrates neighboring applicators 642 sharing sidewall surfaces, it is to be appreciated that embodiments may also include non-circular symmetrically shaped applicators that include spacing between neighboring applicators 642.

Figure 6C:
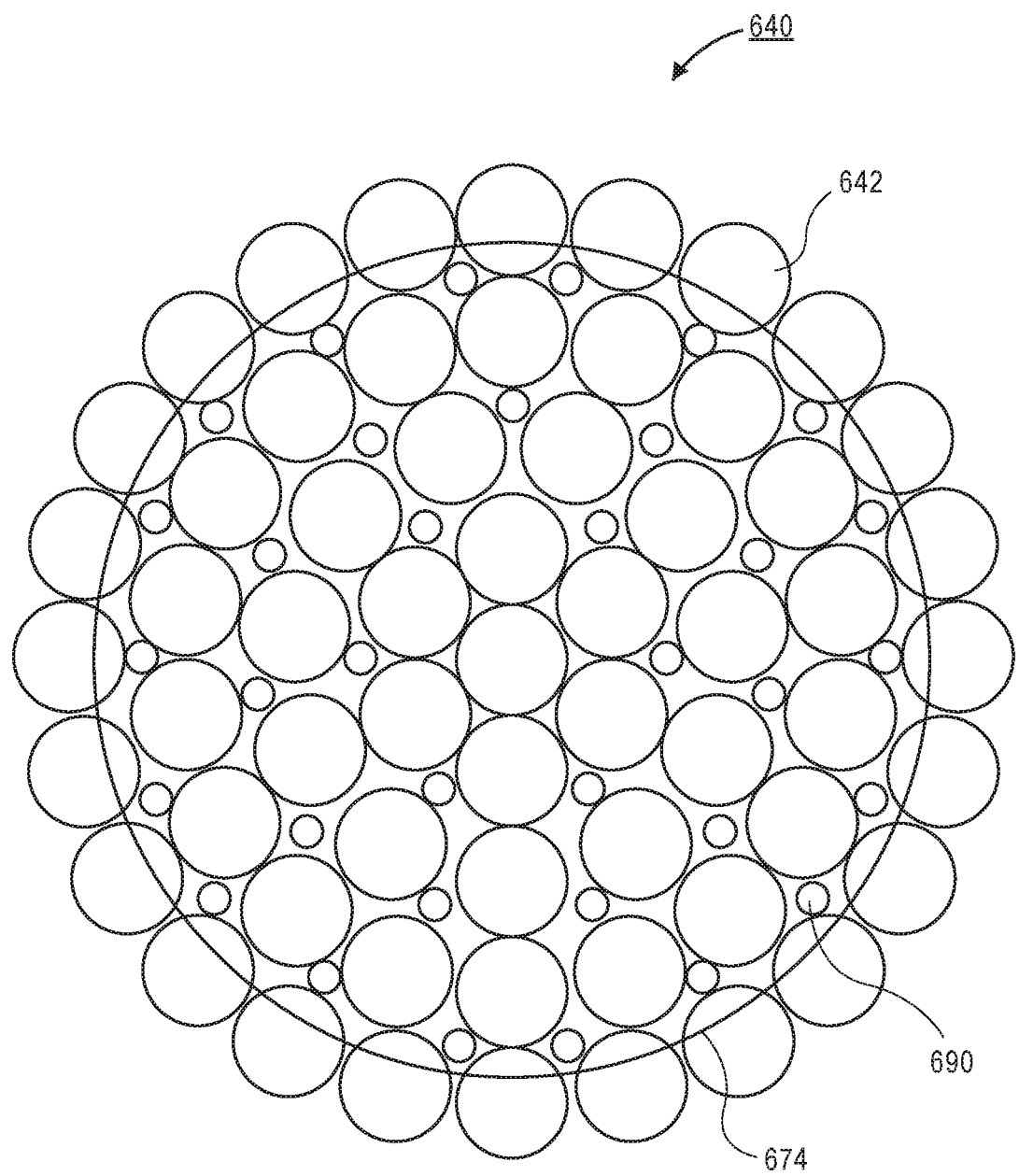
FIG. 6C is a plan view of an array of applicators and a plurality of sensors for detecting conditions of a radiation field and/or a plasma, in accordance with an embodiment.

Referring now to FIG. 6C, an additional plan-view illustration of an array 640 of applicators 642 is shown according to an embodiment. The array 640 in FIG. 6C is substantially similar to the array 640 described above with respect to FIG. 6A, except that a plurality of sensors 690 are also included. The plurality of sensors provides improved process monitoring capabilities that may be used to provide additional feedback control of each of the modular high-frequency power sources 505. In an embodiment, the sensors 690 may include one or more different sensor types 690, such as plasma density sensors, plasma emission sensors, radiation field density sensors, radiation emission sensors, or the like. Positioning the sensors across the surface of the substrate 674 allows for the radiation field and/or plasma properties at given locations of the processing chamber to be monitored.

According to an embodiment, every applicator 642 may be paired with a different sensor 690. In such embodiments, the output from each sensor 690 may be used to provide feedback control for the respective applicator 642 to which the sensor 690 has been paired. Additional embodiments may include pairing each sensor 690 with a plurality of applicators 642. For example, each sensor 690 may provide feedback control for multiple applicators 642 to which the sensor 690 is proximately located. In yet another embodiment, feedback from the plurality of sensors 690 may be used as a part of a multi-input multi-output (MIMO) control system. In such an embodiment, each applicator 642 may be adjusted based on feedback from multiple sensors 690. For example, a first sensor 690 that is a direct neighbor to a first applicator 642 may be weighted to provide a control effort to the first applicator 642 that is greater than the control effort exerted on the first applicator 642 by a second sensor 690 that is located further from the first applicator 642 than the first sensor 690.

Figure 6D:
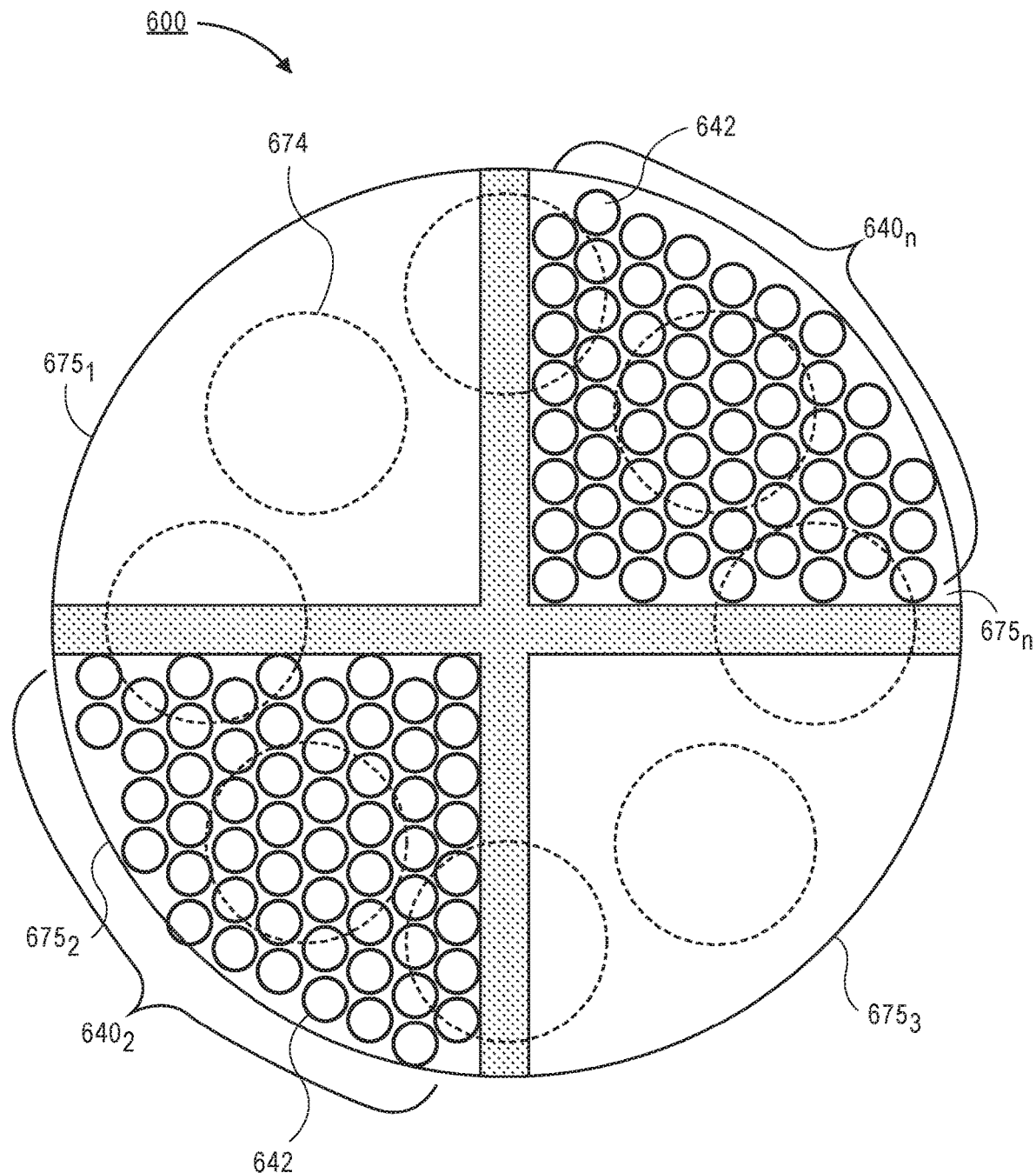
FIG. 6D is a plan view of an array of applicators that are formed in two zones of a multi-zone processing tool, in accordance with an embodiment.

Referring now to FIG. 6D, an additional plan-view illustration of an array 640 of applicators 642 positioned in a multi-zone processing tool 600 is shown, according to an embodiment. In an embodiment, the multi-zone processing tool 600 may include any number of zones. For example, the illustrated embodiment includes zones $675_1$-$675_n$. Each zone 675 may be configured to perform different processing operations on substrates 674 that are rotated through the different zones 675. As illustrated, a first array $640_2$ is positioned in zone $675_2$ and a second array $640_n$ is positioned in zone $675_n$. However, embodiments may include multi-zone processing tools 600 with an array 640 of applicators 642 in one or more of the different zones 675, depending on the needs of the device. The spatially tunable density of the plasma and/or radiation field provided by embodiments allows for the accommodation of nonuniform radial velocity of the rotating substrates 674 as they pass through the different zones 675.

Figure 7:
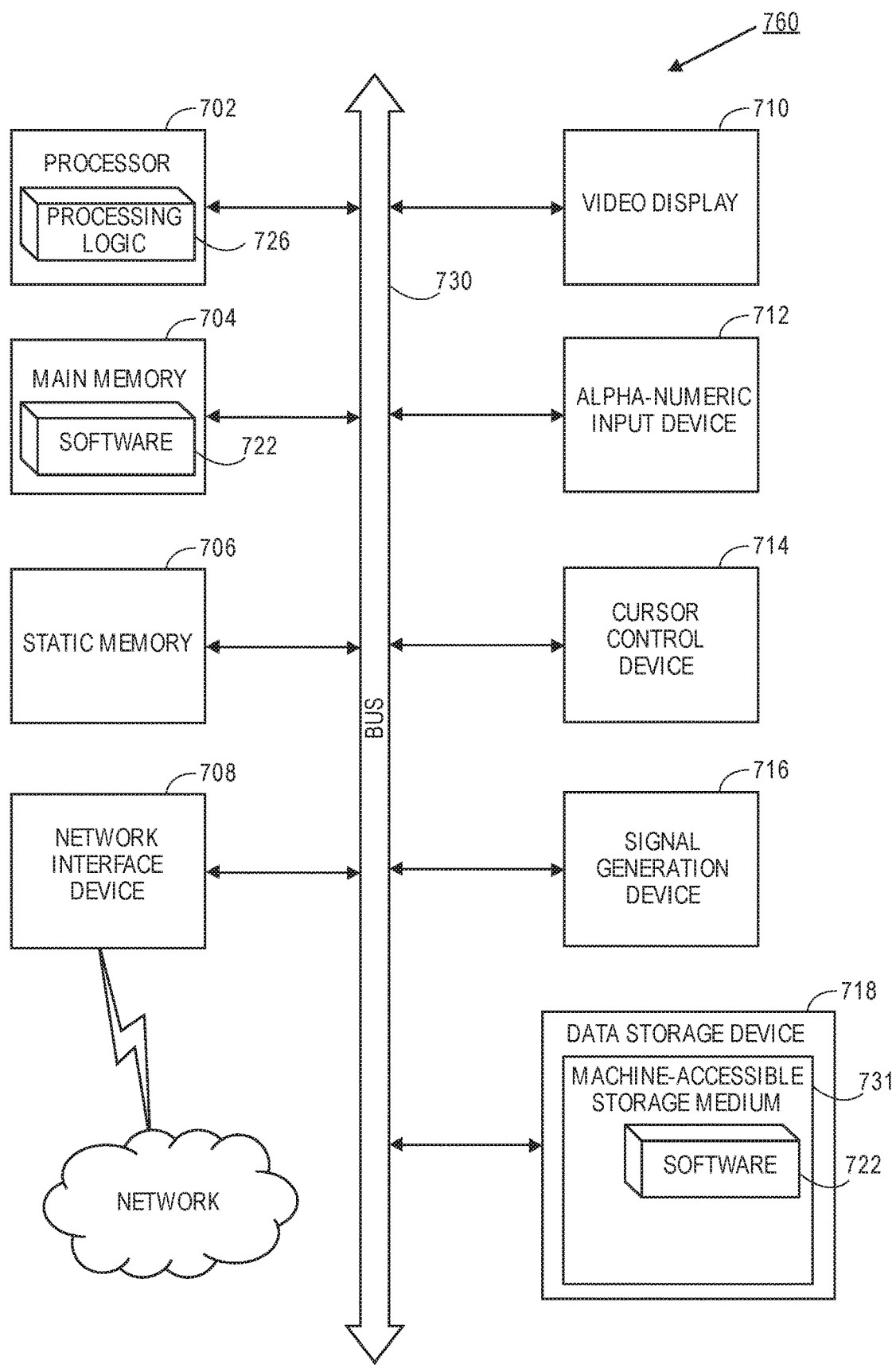
FIG. 7 illustrates a block diagram of an exemplary computer system that may be used in conjunction with a high-frequency plasma tool, in accordance with an embodiment.

Referring now to FIG. 7, a block diagram of an exemplary computer system 760 of a processing tool is illustrated in accordance with an embodiment. In an embodiment, computer system 760 is coupled to and controls processing in the processing tool. Computer system 760 may be connected (e.g., networked) to other machines in a Local Area Network (LAN), an intranet, an extranet, or the Internet. Computer system 760 may operate in the capacity of a server or a client machine in a client-server network environment, or as a peer machine in a peer-to-peer (or distributed) network environment. Computer system 760 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 760, the term "machine" shall also be taken to include any collection of machines (e.g., computers) that individually or jointly execute a set (or multiple sets) of instructions to perform any one or more of the methodologies described herein.

Computer system 760 may include a computer program product, or software 722, having a non-transitory machine-readable medium having stored thereon instructions, which may be used to program computer system 760 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 760 includes a system processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

System processor 702 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 702 may also be one or more special-purpose processing devices such as an application specific integrated circuit (ASIC), a field programmable gate array (FPGA), a digital signal system processor (DSP), network system processor, or the like. System processor 702 is configured to execute the processing logic 726 for performing the operations described herein.

The computer system 760 may further include a system network interface device 708 for communicating with other devices or machines. The computer system 760 may also include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium 731 (or more specifically a computer-readable storage medium) on which is stored one or more sets of instructions (e.g., software 722) embodying any one or more of the methodologies or functions described herein. The software 722 may also reside, completely or at least partially, within the main memory 704 and/or within the system processor 702 during execution thereof by the computer system 760, the main memory 704 and the system processor 702 also constituting machine-readable storage media. The software 722 may further be transmitted or received over a network 720 via the system network interface device 708. In an embodiment, the network interface device 708 may operate using RF coupling, optical coupling, acoustic coupling, or inductive coupling.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A high-frequency emission module, comprising:
a solid state high-frequency power source;
an applicator for propagating high-frequency electromagnetic radiation from the power source; and
a thermal break coupled between the power source and the applicator, wherein the thermal break comprises:
a substrate;
a trace on the substrate;
a ground plane, wherein the substrate is intervening between the trace and the ground plane; and
a thermal block beneath the ground plane, wherein the ground plane is intervening between the substrate and the thermal block, the thermal block comprising a plurality of fins pointing in a direction away from the ground plane.

2. The high-frequency emission module of claim 1, wherein the thermal block solution is directly attached to the ground plane.

3. The high-frequency emission module of claim 1, wherein the trace extends from a first end of the substrate to a second end of the substrate.

4. The high-frequency emission module of claim 3, wherein a portion of the trace over the first end of the substrate is coupled to the power source by a coaxial cable.

5. The high-frequency emission module of 3, wherein the trace comprises a first width at the first end of the substrate and a second width at the second end of the substrate.

6. The high-frequency emission module of claim 1, wherein the thermal break is configured to provide impedance matching between the power source and the applicator.

7. A processing tool, comprising:
a processing chamber; and
a modular high-frequency emission source, comprising:
a plurality of high-frequency emission modules, wherein each high frequency emission module comprises:
an oscillator module;
an amplification module coupled to the oscillator module;
a thermal break coupled to the amplification module, wherein the thermal break comprises a substrate, a trace across the substrate, a ground plane, and a thermal block, wherein the substrate is intervening between the trace and the ground plane, the thermal block beneath the ground plane, wherein the ground plane is intervening between the substrate and the thermal block, the thermal block comprising a plurality of fins pointing in a direction away from the ground plane; and
an applicator, wherein the applicator is coupled to the amplification module by the thermal break, and wherein the applicator is positioned opposing a chuck in the processing chamber on which one or more substrates are processed.

8. The processing tool of claim 7, wherein the thermal block is directly attached to the ground plane.

9. A thermal break for a high-frequency plasma source, comprising:
a substrate having a first surface and a second surface opposite the first surface, wherein the substrate comprises one or more dielectric layers;
a connector coupled to the substrate, wherein the connector is configured to receive a coaxial cable;
a conductive trace interfacing with the connector, and wherein the conductive trace extends from the connector towards an edge of the substrate opposite from the connector;
a ground plane embedded in the substrate, wherein the ground plane is not electrically coupled to the conductive trace, wherein the substrate is intervening between the conductive trace and the ground plane; and
a thermal block thermally coupled to the substrate, the thermal block beneath the ground plane, wherein the ground plane is intervening between the substrate and the thermal block, the thermal block comprising a plurality of fins pointing in a direction away from the ground plane.

* * * * *